United States Patent [19]

Hughes et al.

[11] Patent Number: 4,876,583
[45] Date of Patent: Oct. 24, 1989

[54] RADIATION-INDUCED SUBSTRATE PHOTO-CURRENT COMPENSATION APPARATUS

[75] Inventors: Arlen J. Hughes, Tustin; Virgil H. Strahan, Orange, both of Calif.

[73] Assignee: The United States of America as represented by the Secretary of the Air Force, Washington, D.C.

[21] Appl. No.: 171,494

[22] Filed: Mar. 21, 1988

[51] Int. Cl.$^4$ ............................................. H01L 29/78
[52] U.S. Cl. ...................................... 357/23.7; 357/4
[58] Field of Search ................................... 357/23.7, 4

[56] References Cited

U.S. PATENT DOCUMENTS

| | | | |
|---|---|---|---|
| 4,368,085 | 1/1983 | Peel | 148/33.3 |
| 4,489,339 | 12/1984 | Uchida | 357/4 X |
| 4,520,382 | 5/1985 | Shimura | 357/53 |
| 4,748,485 | 5/1988 | Vasudev | 357/4 X |
| 4,751,554 | 6/1988 | Schnable | 357/4 |
| 4,761,679 | 8/1988 | Stupp | 357/23.7 X |
| 4,766,482 | 8/1988 | Smeltzer | 357/23.7 |

Primary Examiner—Martin H. Edlow
Attorney, Agent, or Firm—Jacob N. Erlich; Donald J. Singer

[57] ABSTRACT

A radiation-induced substrate photo-current compensation apparatus for a silicon FET on a sapphire substrate having an additional pair of electrodes on the substrate in a precise geometrical relationship to the source and drain electrodes to provide a compensating substrate current which flows into the source and drain electrodes, eliminating the undesirable effects of radiation on the semiconductor.

5 Claims, 1 Drawing Sheet

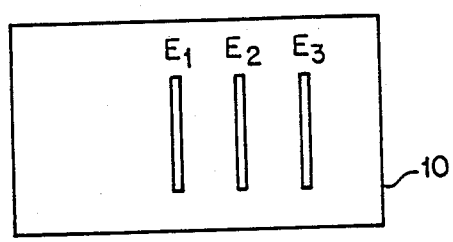
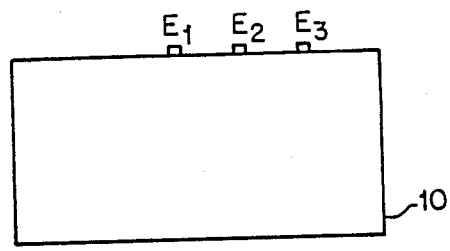
FIG. 1a
FIG. 1b
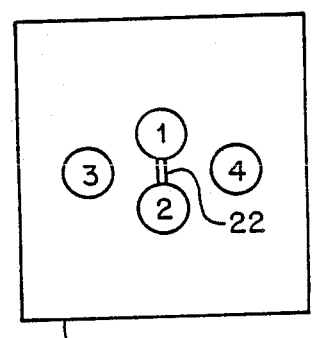
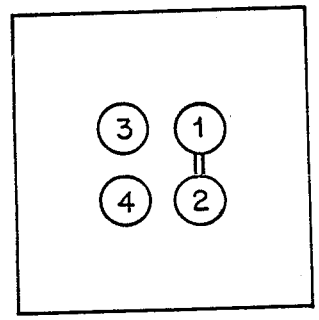
FIG. 2a
FIG. 2b
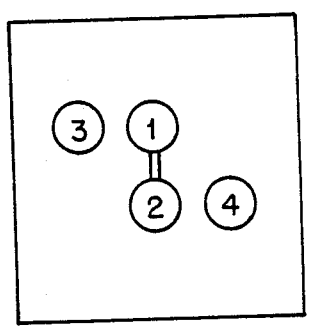
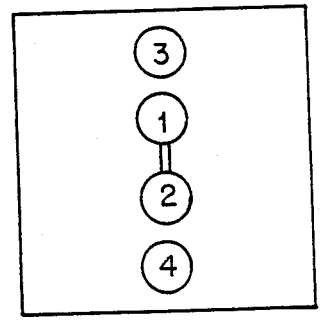
FIG. 2c
FIG. 2d

RADIATION-INDUCED SUBSTRATE PHOTO-CURRENT COMPENSATION APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to CMOS-SOS integrated circuits, and in particular to a radiation-induced substrate photo-current compensation apparatus.

The state of the art of integrated circuit photo-current compensation circuits is well represented and alleviated to some degree by the prior art apparatus and approaches which are contained in the following U.S. Patents:

U.S. Pat. No. 4,368,085 issued to Peel on Jan. 11, 1983;

U.S. Pat. No. 4,489,339 issued to Uchida on Dec. 18, 1984; and

U.S. Pat. No. 4,520,382 is issued to Shimura on May 28, 1985.

The Peel patent describes a silicon-on-sapphire semiconductor apparatus and the method of fabrication thereof. A silicon nitride layer is disposed over the upper edge of the silicon island, and acts to prevent gate oxide breakdown.

The Uchida patent relates to an SOS MOSFET with a self-aligned channel contact. This MOS type semiconductor device effectively supplying potential to a substrate region under the channel forming region of the MOS transistor on an insulating substrate. The potential is supplied to the one conductivity type substrate region under the channel forming region which is provided on an insulating substrate and has an extended portion extending in the channel length direction, through a substrate potential take-out region of one conductivity type connecting to the extended substrate.

The Shimura patent illustrates a monolithic semiconductor integrated circuit device suited for suppressing a leakage current ascribable to an inversion layer accompanied to MOS (Metal-oxide-Semiconductor) structure.

Silicon-on-sapphire (SOS) is an intrinsically radiation-hard semiconductor technology. Silicon-on-sapphire semiconductors have been the subject of research and development for a number of years. Silicon-on-sapphire integrated circuitry is presently the leading candidate for implementation in strategic equipment such as a missile which must operate/survive a peak-dose-rate radiation event. The performance requirements for new missile systems are quite severe. Thus, the search for new device physics/circuit approaches or techniques which can be applied to silicon-on-sapphire semiconductors to yield increased radiation hardness, i.e., total dose and especially transient performance, is an active and crucial task. This situation applies to a wide class of silicon-on-sapphire circuitry generally, but in specific areas the need is especially critical.

In a high-dose-rate radiation event, electron-hole pairs which are generated thereby, create transient photocurrents. Experimental evidence has shown that the total photocurrent in a silicon FET on a sapphire substrate is made up of two distinct components: (1) a primary photocurrent ($I_{pp}$) which flows directly in the silicon semiconductor between the device source and drain, and (2) a substrate photocurrent ($I_{ps}$) which flows in the substrate beneath, between, and around the source and drain. The experimental evidence is that the substrate photocurrent is the major component of the radiation induced photocurrent. Estimates for the ratio ($I_{ps}/I_{pp}$) range from a factor of 3-5 to as high as a factor of 10.

Failure vehicles or mechanisms for silicon-on-sapphire integrated circuits in a high-dose-rate ionizing radiation event are of two types: (1) a total dose failure due to threshold shift is always an issue and must be considered, and (2) a failure due to transient photocurrents which can destroy memory data integrity and render the circuit at least temporarily inoperative. In a peak-dose-rate event, this transient photocurrent failure mode would be the probable major failure mode. Since ($I_{ps}/I_{pp}$) is greater than one, the substrate photocurrent, $I_{ps}$, is seen to be the major-failure-mode contributor.

In the present state-of-the-art for silicon-on-sapphire semiconductor circuit design, the primary photocurrent $I_{pp}$ which flows in the silicon is a consideration in device/circuit design. For example, FETs may be sized to reflect expected $I_{pp}$s in a circuit. Thus there has been an attempt in the prior art to compensate for the silicon photocurrent $I_{pp}$. However, there presently appears to be no circuit compensation techniques for the prompt gamma photocurrent $I_{ps}$ flowing in the substrate which have as yet been developed or employed. It is clear, however, that the electronic/electrical behavior of the sapphire substrate plays a key role in determining the performance of a silicon-on-sapphire semiconductor transistor or circuit in a peak-dose-rate ionizing radiation environment and the prior art/current practice is clearly deficient.

SUMMARY OF THE INVENTION

The present invention utilizes a silicon-on-sapphire (SOS) radiation hardened semiconductor device having additional electrodes in the substrate in a precise geometrical relationship to the source and drain electrodes, the generated substrate current ($I_{ps}$) is made to flow into the source and drain electrodes, eliminating the undesirable effects of radiation on the semiconductor.

It is one object of the present invention, therefore, to provide an improved radiation-induced substrate photo-current compensation apparatus.

It is another object of the invention to provide an improved radiation-induced substrate photo-current compensation apparatus wherein an additional pair of electrodes are positioned with respect to the source and drain electrodes to offset radiation induced photo-current.

It is yet another object of the invention to provide an improved radiation-induced substrate photo-current compensation apparatus in which the compensation current path lengths are kept to a minimum.

It is still another object of the invention to provide an improved radiation-induced substrate photo-current compensation apparatus which is economical to produce and utilizes conventional, currently available components that lend themselves to standard mass production manufacturing techniques.

These and other advantages, objects and features of the invention will become more apparent after considering the following description taken in conjunction with the illustrative embodiment in the accompanying drawings.

BRIEF DESCRIPTION OF THE DRAWINGS

FIG. 1a is a top schematic representation of the electrode shield concept of the substrate photo-current compensation apparatus;

FIG. 1b is a front schematic representation of the apparatus of FIG. 1a; and

FIGS. 2a-2d are top views of electrode geometries for an SOS-FET with substrate photo-current compensation.

DESCRIPTION OF THE PREFERRED EMBODIMENT

Referring now to FIG. 1a, there is shown a schematic representation of the electrode shield for a silicon-on-sapphire (SOS) field effect transistor (FET). The source ($E_1$) and drain ($E_3$) electrodes are arranged on the top surface of a sapphire ($Al_2O_3$) substrate 10. A shield electrode ($E_2$) is positioned between the source and drain electrodes $E_1$, $E_3$. In FIG. 1b there is shown a simplistic front schematic of the radiation-induced photo-currents between the electrodes $E_1$, $E_2$ and $E_3$ in the sapphire substrate 10.

The present photo-current compensation apparatus is provided with the goal of increased radiation hardness. It approaches the radiation-induced photo-current problem with purpose-built circuits/circuitry whose role is to operate upon, modify, route, convey, control, etc., the substrate photocurrent $I_{ps}$ which arises through the phenomenon of temporary transient conductivity of the sapphire substrate. There are two specific compensation techniques for preventing or offsetting the photocurrent $I_{pp}$: (1) shielding and (2) compensation. While these two techniques involve physical geometries which, on the surface appear to differ, it will be well understood by the following examples that their concept and function are operatively similar. The basic concept is to prevent either by interruption or by compensation the substrate-based adverse effects of radiation and thereby mitigate the effect of transient photocurrent upon the silicon SOS circuitry for the purpose of enhanced radiation hardness and performance.

The first apparatus of FIGS. 1a, 1b involves shielding. In a silicon circuit on sapphire, it is possible to make use of shielding electrodes or "guard" rings to isolate one region of the device from another region. For example a p+ "channel stop" serves to isolate one n-region from another n-region. For this to be effective one generally diffuses the p dopant through to the substrate. Then, at least for moderate voltage excursions, the two n-regions are isolated. A similar electrode geometry for a FET on sapphire is presented. In FIG. 1a, three long electrodes $E_1$, $E_2$ and $E_3$ are shown. However, the photo-current flow of FIG. 1b raises the issue of whether or not electrode $E_2$ can shield electrode $E_1$ from electrode $E_3$. Calculations may be made assuming the sapphire becomes temporarily conductive with a dose-rate-dependent resistivity. These have shown that $E_2$ is not totally effective in reducing the current between $E_1$ and $E_3$. While there is some effect, the desired isolation of electrode $E_1$ from electrode $E_3$ is not fully obtained.

The physical picture which emerged is as follows. The total conductance between any two electrodes is due to a number of conducting paths. Some of these lie in the sapphire ($Al_2O_3$) substrate directly under and adjacent to the electrodes. These are called "direct" paths. Other paths fringe out of the sides of one electrode and down into the $Al_2O_3$ at considerable depths and then come in around the backside of the other electrode. It is apparent that the fringing paths are responsible for most of the conductivity between electrodes $E_1$ and $E_3$ and are not strongly effected by electrode $E_2$. The conclusion was that shield or guard electrodes were a slight improvement but were unlikely to represent a good implementation of the compensation geometry for substrate photo-currents.

Turning now to FIGS. 2a through 2d there is shown the electrode geometries for substrate photo-current compensation in a SOS-FET. In FIG. 2a there is shown the alignment of a source electrode 1 and a drain electrode 2 on a sapphire substrate 20. A channel 22 is shown between the source and drain electrodes 1, 2. A pair of compensation electrodes 3, 4 which are positioned on opposite sides of the channel 22, are each substantially equidistant to the source and drain electrodes 1, 2. In FIGS. 2b through 2d there are shown additional substrate photo-current compensation geometries for electrodes 3, 4.

Since the shield electrodes configuration was not as effective due to the extended nature of the substrate, a concept of substrate photocurrent compensation evolved. The concept is as follows. There are two electrodes on a substrate that are each at some potential. They may be the source and drain of a given transistor or may be elements of different but adjacent transistors. It may be shown that the substrate current flows between the electrodes. The current that is removed from the source node, flows into the drain node. Since this flow cannot be stopped, it is necessary to input an appropriate additional current into the source and to remove the same amount of current from the drain node. This is accomplished by adding two extra electrodes on the substrate near the source and drain. Two or more extra electrodes are required since it can be shown analytically that one electrode will not work. As far as the source or drain are concerned, there is no current flow between the source and drain due to radiation-induced conductivity.

The source and drain for a minimum geometry FET are approximately square. For a model, however, each square has been replaced by a hemispherical contact embedded in the substrate. Thus let electrodes 1 and 2 be the source and drain nodes and let electrodes 3 and 4 be substrate compensating contacts which do not touch electrodes 1 and 2. FIGS. 2a through 2d show top views of these four geometries. By analysis, a 4 by 4 matrix equation was solved with the constraint that the current flow of electrodes 1 and 2 was to be zero. Thus only a 2×2 matrix inversion is required. In FIG. 2a, the determinant vanishes, since no set of voltages on electrodes 3 and 4 will produce zero current at both electrodes 1 and 2. For FIGS. 2b-2d, the determinant does not vanish and a solution for $V_3$ and $V_4$, given $V_1$ and $V_2$, is therefore possible. The substrate compensation apparatus of each provide radiation-induced photo-current compensation.

In FIG. 2a, the conductance $\sigma_{31}$ is, by symmetry, the same as the conductance $\sigma_{32}$ and similarly by $\sigma_{41} = \sigma_{42} = \sigma_{31} = \sigma_{32}$. The determinant thus vanishes and there is no solution. On the other hand, in FIG. 2b, electrode 3 is physically closer to electrode 1 than it is to electrode 2. Therefore, $\sigma_{31} \neq \sigma_{32}$ and similarly $\sigma_{41} \neq \sigma_{42}$. The smaller $\sigma_{32}$ is compared to $\sigma_{31}$ and the smaller $\sigma_{41}$ is compared to $\sigma_{42}$, the "better conditioned" is the mathematical solution. Physically, this means that electrodes 3 and 4 are not working against each other and smaller voltages $V_3$ and $V_4$ can be used. For this reason, the geometry of FIG. 2d is said to be optimum.

The compensation of substrate photocurrent apparatus, as illustrated and described above, relates to the top (device) surface of the sapphire. The bottom substrate surface is, however, also a good candidate for substrate compensation circuitry. For example, the package ground could be held at a potential relative to the silicon IC to potentially modify transient photocurrents. A further example might be the deposition of an interdigitated set of pairs of conducting fingers with a separation of the order of the substrate thickness and held at potentials $V_5$ and $V_6$. The fields that can be achieved with practical voltages are likely to be small compared to those associated with (closely spaced) top surface eletrodes and therefore may or may not be of practical importance. As a concept, however, backsurface circuity and applications of voltage is a viable approach to substrate photo-current compensation.

The above examples demonstrate that the compensation technique is operationally practical. However, while only the current between the source and drain of a given transistor were described, it is recognized that there will be some coupling over a larger region. Therefore, FET-FET interactions must also be considered to achieve optimum hardness. The voltages present in an IC circuit are time static at some nodes and time dynamic at other nodes. The compensating electrode voltages thus could be dynamic or might be at appropriate DC voltages reflecting load points. The cancellation would therefore not be as complete as for the earlier case.

In order to design an optimum "composite" silicon and sapphire circuit, circuit analysis and modelling for a particular application may be necessary. The various coupling data needed for the sapphire circuit, e.g., the conductance as a function of electrode shape and separation will have to be obtained from more complicated models or from experimental measurements on test chips. It is clear that there is a circuits cost in the implementation of the photo-current compensation apparatus. Additional silicon real estate and perhaps additional supply voltages may be required. In a strategic missile system, much of the circuitry is circumvented and not required to function through the peak-dose-rate event. However, some circuits, such as state retention memories must maintain data integrity during and through the event. The additional rad hard performance inherent in the present invention is an attractive and necessary trade. This example is not an isolated one and the emerging SDI thrust will create additional requirements for the substrate photo-current compensation apparatus.

Although the invention has been described with reference to a particular embodiment, it will be understood to those skilled in the art that the invention is capable of a variety of alternative embodiments within the spirit and scope of the appended claims.

What is claimed is:

1. A radiation-induced substrate photo-current compensation apparatus for a silicon FET on a sapphire substrate comprising in combination:

first and second electrodes formed on the top surface of said silicon FET, said first and second electrodes aligned with each other to establish a conductive channel therebetween in said Silicon FET, third and fourth electrodes formed on the top surface of said sapphire substrate, said third electrode being operatively aligned with said first electrode, said fourth electrode being operatively aligned with said second electrode, during a radiation event when a photo-current flows through said sapphire substrate from said first electrode to said second electrode, said third electrode provides current to said first electrode and said fourth electrode receives current from said second electrode thereby compensating for the radiation induced photo-current between said first and second electrodes.

2. A photo-current compensation apparatus as described in claim 1 wherein said third and fourth electrodes are aligned with each other and are respectively equidistant from said first and second electrodes.

3. A photo-current compensation apparatus as described in claim 1 wherein said third and fourth electrodes are positioned on opposite sides of the central axis between said first and second electrodes, said third electrode being positioned substantially closer to said first electrode than to said second electrode, said fourth electrode being positioned substantially closer to said second electrode than to said first electrode.

4. A photo-current compensation apparatus as described in claim 1 wherein said third electrode is operatively aligned with said first electrode on the central axis between said first and second electrodes, said fourth electrode is operatively aligned with said second electrode on the central axis between said first and second electrodes.

5. A photo-current compensation apparatus as described in claim 3 wherein the spacing between said first and third electrodes is the same as the spacing between said second and fourth electrodes.

* * * * *

UNITED STATES PATENT AND TRADEMARK OFFICE
CERTIFICATE OF CORRECTION

PATENT NO. : 4,876,583
DATED : October 24, 1989
INVENTOR(S) : Arlen J. Hughes et al It is certified that error appears in the above-identified patent and that said Letters Patent is hereby corrected as shown below:

In column 4, line 64, change "$=\sigma 42$" to $--=\sigma_{42}--$.

In column 4, line 68, change "42" to $--\sigma_{42}--$.

Signed and Sealed this

Twenty-eighth Day of January, 1992

Attest:

HARRY F. MANBECK, JR.

*Attesting Officer*  Commissioner of Patents and Trademarks